United States Patent [19]

Haven

[11] Patent Number: 6,066,204
[45] Date of Patent: May 23, 2000

[54] HIGH PRESSURE MOCVD REACTOR SYSTEM

[75] Inventor: Victor E. Haven, Westford, Mass.

[73] Assignee: Bandwidth Semiconductor, LLC, Bedford, Mass.

[21] Appl. No.: 08/780,724

[22] Filed: Jan. 8, 1997

[51] Int. Cl.[7] .................................................. C30B 25/14
[52] U.S. Cl. .............................. 117/89; 117/93; 117/102; 117/954; 117/957
[58] Field of Search ............................. 117/89, 93, 102, 117/954, 957

[56] References Cited

U.S. PATENT DOCUMENTS

| | | | |
|---|---|---|---|
| 3,312,571 | 4/1967 | Ruehrwien | 117/93 |
| 3,930,908 | 1/1976 | Jolly | 117/93 |
| 4,246,881 | 1/1981 | Sandhu et al. | 437/192 |
| 4,855,160 | 8/1989 | Luttmer et al. | 427/38 |
| 4,985,281 | 1/1991 | Ahlgren | 117/93 |
| 4,988,640 | 1/1991 | Bohling et al. | 437/81 |
| 5,036,022 | 7/1991 | Kuech et al. | 437/81 |
| 5,064,778 | 11/1991 | Maeda et al. | 437/81 |
| 5,079,184 | 1/1992 | Hatano et al. | 437/107 |
| 5,120,676 | 6/1992 | Melas et al. | 437/81 |
| 5,232,869 | 8/1993 | Frigo et al. | 437/133 |
| 5,433,169 | 7/1995 | Nakamura | 117/93 |
| 5,433,170 | 7/1995 | Toda et al. | 117/103 |
| 5,693,139 | 12/1997 | Nishizawa et al. | 117/93 |

FOREIGN PATENT DOCUMENTS

| | | |
|---|---|---|
| 63255372 | 10/1988 | Japan . |
| 07235505 | 9/1995 | Japan . |
| WO 84/04334 | 11/1984 | WIPO . |

OTHER PUBLICATIONS

Haywood, S.K. et al., "Growth of GaSb by MOVPE: Optimization of Electrical Quality with Respect to Growth Rate, Pressure, Temperature and III/V Ratio", *Journal of Crystal Growth 93* (1988) pp. 56–61 (North–Holland Physics Publishing Division, North–Holland, Amsterdam)).

*Primary Examiner*—Robert Kunemund
*Attorney, Agent, or Firm*—Thomas J. Engellenner; Scott D. Rothenberger; Nutter, McClennen & Fish, LLP

[57] ABSTRACT

An apparatus and method is disclosed for providing vapor-phase epitaxial growth on a substrate using a Metal Organic Chemical Vapor Deposition (MOCVD) process. The process is performed in a reactive chamber pressurized to greater than one atmosphere. The reactant gases to be deposited on the substrate are also pressurized to the equivalent pressure, and then introduced into the reactor chamber. By performing the MOCVD process at a pressure greater than one atmosphere, a reduced amount of reactant gas is required to complete the deposition process.

12 Claims, 3 Drawing Sheets

HIGH PRESSURE MOCVD REACTOR SYSTEM

BACKGROUND OF THE INVENTION

This invention relates generally to an apparatus and a method for providing vapor-phase epitaxial growth on a substrate, and in particular to an apparatus and a method for providing vapor-phase epitaxial growth on a substrate using Metal Organic Chemical Vapor Deposition (MOCVD).

Thin films of metal are frequently fabricated upon solid substrates for use in the electronics and the opto-electronics industries by what is termed a Metal Organic Chemical Vapor Deposition (MOCVD) process. The process typically comprises introducing the vapor of at least one metal-organic compound, i.e. the precursor of the metal, into a reaction chamber under conditions of temperature and pressure such that the precursor decomposes to give a deposit of the metal on a solid substrate contained within the reaction chamber.

In the deposition of what is termed Group III - V semiconducting materials, vapors comprising at least one element from Group III of the Periodic Table are mixed with vapors of at least one element from Group V of the Periodic Table, and the resulting thin film material is a Group III - V semiconductor crystal. Examples of such semiconductor crystals are InP, GaAs, $Al_xGa_{1-x}As$, $GaAs_xP_{1-x}$, $In_xGa_{1-x}As_yP_{1-y}$. Group III - V semiconductor crystals are extremely useful as materials for diodes, ultra-high speed semiconductor devices, light-emitting devices, etc., and consequently the demand for these compound semiconductor crystals has increased.

In one method for producing Group III-V compound semiconductors using vapor-phase growth, an alkyl compound of a Group III element in the vapor phase and a hydride or alkyl compound of a Group V element in the vapor phase are heat decomposed in a chamber having a substrate therein. The heating causes the vapors to deposit and form Group III-V crystal on the substrate. This method is known as Metal Organic Chemical Vapor Deposition. In the production of compound semiconductors such as GaAs or $Al_xGa_{1-x}As$ through the MOCVD process, arsine $AsH_3$ is widely used as the source of arsenic. By combining and decomposing arsine with an alkyl compound of a Group III element such as Gallium, GaAs crystals exhibiting satisfactory light emission characteristics can be grown.

Group III-V semiconductor compounds may also be grown using phosphorus as the Group V element and indium as the element from Group III, forming a semiconductor compound of InP. Phosphorus based compounds are widely used in many important opto-electronic devices such as lasers, light emitting diodes (LEDs), space solar cells, and detectors. Typically, phosphine, is heat decomposed in a chamber to generate the phosphorus source.

While arsine and phosphine has proven useful in producing Group III-V semiconductor compounds, both of these chemicals are toxic and classified as hazardous materials by the Environmental Protection Agency. In addition to being toxic, phosphine is also pyrophoric. Consequently, strict federal and state regulations exist on the use, storage, and disposal of arsine and phosphine. The disposal of waste byproducts of a Group III - V MOCVD process is an important environmental consideration and is highly regulated. Currently, costs to dispose of phosphorus-containing hazardous waste generated by MOCVD growth of InP or GaInP crystals are nearly equal to the cost of purchasing high purity phosphine, approximately three hundred dollars per pound. In attempting to reduce these waste byproducts, the Waste Minimization Act requires industry to implement detailed waste minimization plans for toxic materials, and imposes strict fines for non compliance.

The use of arsine and phosphine in the MOCVD process is of particular concern since, in addition to being toxic, they are also used in very high ratios relative to the volume of Group III material in the MOCVD process. For example in the production of InP in a conventional reaction chamber operating at near optimum conditions, the ratio of phosphine to the indium material is in the range of 20:1 to 60:1 at atmospheric pressure (760 torr). Many MOCVD processes operate below atmospheric pressure to improve the purity and uniformity of the semiconductor crystals. However, a reduction in chamber pressure requires an increase in the ratio of Group V material to Group III material. For instance, at a pressure of 76 torr, the ratio of the arsine or phosphine, to the Group III material, increases to the range of 200:1 to 500:1. The move to lower pressures for the MOCVD process clearly exasperates the problem, since lower pressure usually means that higher flows of the vapor must be maintained. Lower Group V to Group III ratios are possible by reducing the total main flow of the Group V gas into the chamber and thus the velocity of the gas. However, the thickness uniformity of the deposited layer may be compromised. Severe recirculation may occur within the chamber, leaving deposits inside the gas injection manifold and degrading interface abruptness.

Gallium Nitride, GaN, is one of the most promising materials for opto-electronic devices operating in the ultra-violet to ultra-blue wavelength region. Blue (LEDs) complete the primary color spectrum, and create the possibility of large full-color LED displays. While the use of these devices shows good potential, fabrication of GaN crystals with conventional MOCVD techniques requires an abundance of ammonia as the source of nitrogen. Using a conventional vertical flow reactor at low pressure and using ratios of 3000:1 for the Group V-III materials, good quality could not be grown even at temperatures of 900° C. Furthermore, insufficient nitrogen utilization leads to vacancies which dominate electronic properties, material desorption which limits growth rate, and reduced growth temperature, leading to poor crystalline quality. An excess of nitrogen waste results as a byproduct of the process.

Strict environmental regulations on the use and disposal of hazardous toxins used in the production of Group III-V semiconductor compounds increase the cost of production and expose semiconductor producers to increased liability. In addressing this problem, process changes are required to reduce waste generation. In one known approach, the waste is treated after processing to convert it into non-hazardous material. This approach requires extensive waste management facilities, and, in many cases, is not practical unless the organization is certified to treat hazardous waste.

A more desirable approach is to make fundamental process changes to the MOCVD process of creating Group III-V semiconductor crystals by increasing source decomposition to reduce the amount of the toxic reactants such as arsine and phosphine used in the process, and thus also reduce proportionately the amount of the waste byproducts generated.

Accordingly, it is an object of the invention to obviate the above noted disadvantages of prior MOCVD reaction chambers and methods for utilizing the same.

A further object of the invention includes reducing the quantities of toxic reactants in a MOCVD process for fabricating semiconductor crystals.

Another object of the invention is to reduce the waste exhaust of reactant gases in a MOCVD process for fabricating semiconductor crystals.

Other objects include reducing the ratio of the amount of Group V material to Group III material, over conventional ratios, in a MOCVD process for creating high quality semiconductor devices, or the ratio of the amount of Group VI material to Group II material, over conventional ratios, in a MOCVD process for creating high quality semiconductor devices.

SUMMARY OF THE INVENTION

The Metal Organic Chemical Vapor Deposition (MOCVD) system of the present invention achieves reduced usage of gaseous reactants by performing the deposition in a chamber above atmospheric pressure. In particular the MOCVD system includes a reactor chamber having a susceptor or substrate holder enclosed within the interior of the chamber for receiving a substrate on which a semiconductor crystal is deposited. The reactant gases are introduced into the chamber and mixed to form a vapor that is deposited on the substrate. The substrate holder or susceptor is heated to a high temperature to promote decomposition of the reactant gases.

In one aspect of the invention, the reactor chamber is maintained at an internal pressure greater than one atmosphere. It was discovered that the high pressure within the chamber promotes a highly efficient decomposition of the gaseous reactants, and thus the deposition process can be performed with a reduced quantity of reactants. For example, the fabrication of InP semiconductor crystals using conventional MOCVD methods requires that 10 to 100 times more phosphorus be used to produce quality crystals suitable for semiconductor devices when the chamber pressure is maintained at or below atmospheric pressure. In contrast, a reduction in the amount of the waste gas is achieved, under the instant invention, since more of the reactant gases are deposited on the substrate, rather than becoming surplus gases that are exhausted from the system.

The internal chamber pressure is maintained through the controlled introduction of an inert gas into the chamber during the MOCVD process. The gas is inert in the sense that it does not participate in the MOCVD process other than to pressurize the chamber. Examples of inert gases suitable for practicing the present invention are hydrogen, nitrogen, and argon. A pressurizer can be used for introducing an inert gas into the chamber to pressurize and maintain the chamber above one atmosphere. In one embodiment, the pressurizer includes a gas booster pump for increasing the pressure of the inert gas, and a gas inlet coupled with the gas booster pump for introducing the pressurized inert gas into the chamber. Other aspects of the invention provide for a pressure release valve that prevents the pressure within the chamber from exceeding a desired pressure level.

Additional aspects of the invention include varying the quantity of the gaseous reactant introduced into the chamber as a function of the quantity of inert gas introduced into the chamber. For instance, the quantity of reactant gas required to obtain successful crystal deposits on the substrate decreases as the quantity of inert gas introduced into the chamber increases. This advantageously provides for a system that achieves successful deposition of Group III - V semiconductor materials while utilizing lower quantities of reactant gases than current deposition systems known in the art.

In another aspect of the invention, the reactant gases are injected into the chamber under pressure from the bottom portion of the chamber to accommodate a substrate that is mounted on the underside of the susceptor. The convective forces induced by the high temperature within the chamber and the upward injection promote the upward flow of the vapors onto the substrate. This achieves better utilization of the reactant gases thereby reducing the amount of waste gas.

BRIEF DESCRIPTION OF THE DRAWINGS

The foregoing and other objects, features and advantages of the invention will be apparent from the following description and apparent from the accompanying drawings, in which like reference characters refer to the same parts throughout the different views. The drawings, although not to scale, illustrate principles of the invention.

ILLUSTRATED EMBODIMENTS OF THE INVENTION

Figure 1:
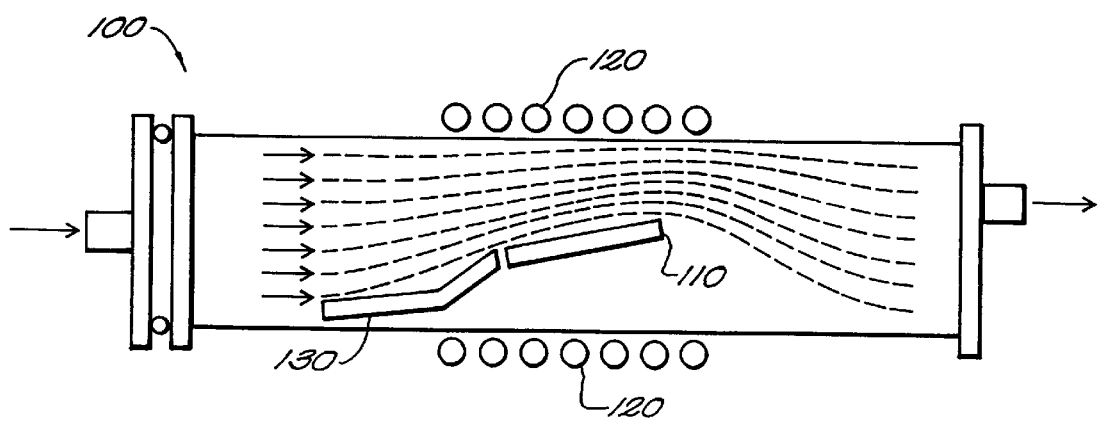
FIG. 1 depicts a MOCVD reactor system having a conventional horizontal flow design.
Figure 2:
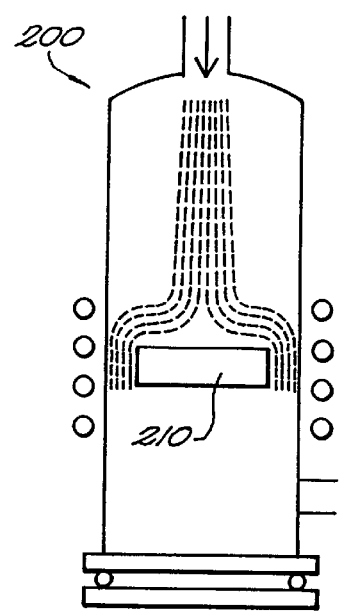
FIG. 2 depicts a MOCVD reactor system having a conventional vertical flow design.

Typically, MOCVD reactors have been configured as horizontal-flow or vertical-flow chambers. FIG. 1 depicts a horizontal-flow chamber 100 wherein the pressure in the chamber is maintained below atmospheric pressure, usually around 0.1 atmospheres. The substrate, on which the semiconductor material is deposited, is mounted on top of a susceptor or substrate holder 110 and heated by coils 120 surrounding the chamber to decompose the reactant gases. The reactant gases are injected into the chamber approximately parallel to the substrate and forced over the substrate by a baffle 130. FIG. 2 shows another conventional chamber design having vertical flow. The reactant gases are injected into the chamber 200 from the top of the chamber for deposition onto a substrate mounted on top of the susceptor 210. Pressure in the chamber is maintained, again, at below atmospheric pressure.

In both these chambers, laminar flow over the substrate is desired for uniform and abrupt film growth. To achieve laminar flow, convective forces from the heated susceptor or substrate holder must be overcome. The convective forces drive the flow of reactant gases away from the substrate and decrease the amount of reactant available for deposit. This difficulty is typically overcome with high gas velocities over the susceptor in conjunction with reduced reaction chamber pressure and rotation of the wafer. The high gas velocity moves the gases over the hot zone very quickly. However, as a result of the high velocity, gases with a low cracking efficiency, such as phosphine whose cracking efficiency of is around 20% at customary growth temperatures, do not have time to fully decompose within the chamber. A very large flow of phosphine is required during InP growth to yield enough phosphorus overpressure to keep the crystalline structure from decomposing on the substrate.

While conventional MOCVD reactor chambers are operated at pressures below one atmosphere, the applicant has discovered that high quality semiconductor crystals can be fabricated using less reactant gas than used in prior systems when the chamber is operated at pressures greater than one atmosphere. As will be more fully described later, it has been found that a MOCVD chamber operated at a pressure of three atmospheres and used to produce InP wafers in accordance with the current invention requires approximately equal amounts of phosphine and indium material to form good quality crystals. A conventional chamber, operating at 0.1 atmospheres, requires up to five hundred times more phosphine than indium material.

Figure 3:
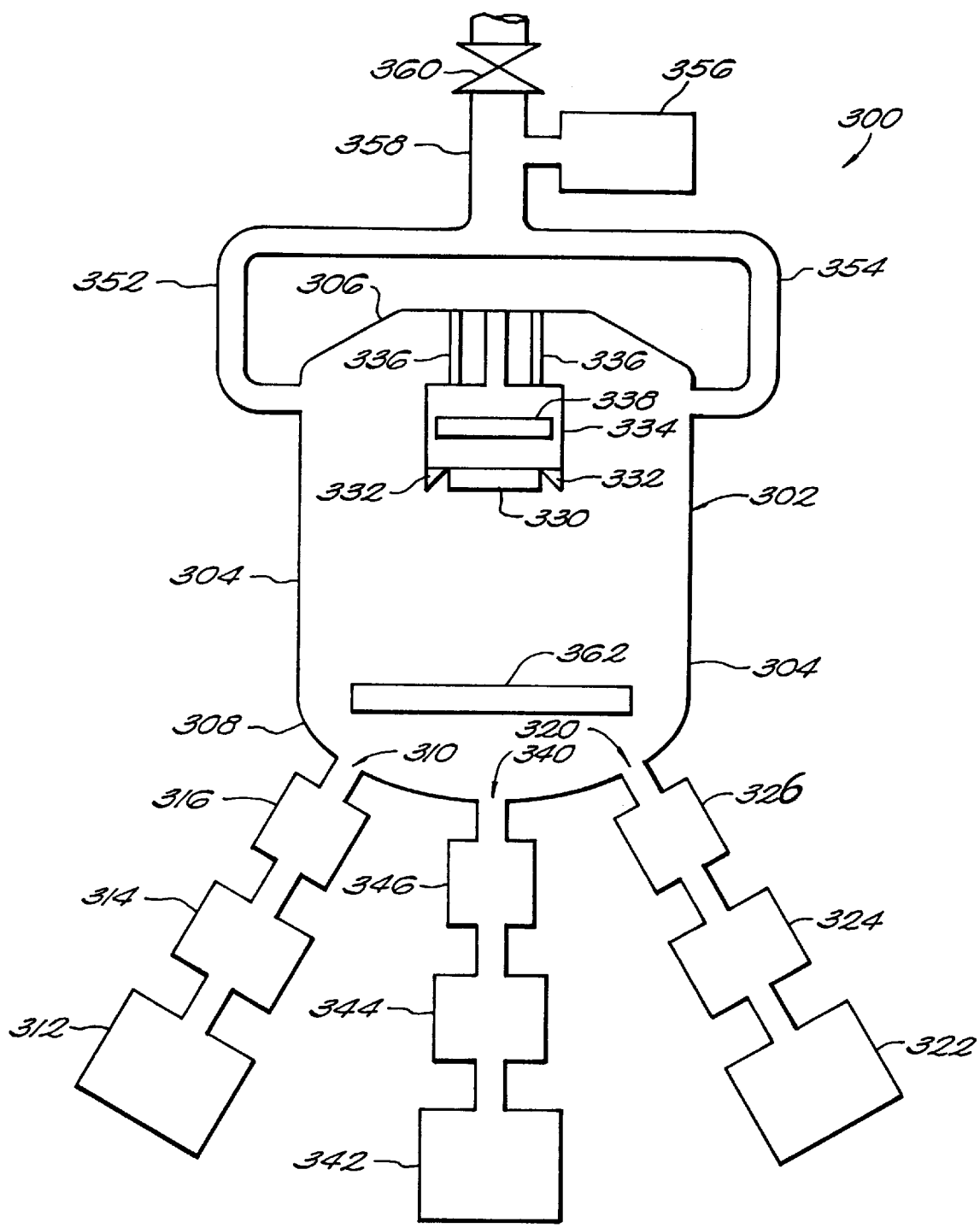
FIG. 3 depicts a MOCVD reactor system having an invertably mounted substrate and a pressurized reactor chamber according to the present invention.

Referring now to FIG. 3, there is shown one embodiment of a MOCVD reactor system 300 for semiconductor crystal growth that operates at a pressure greater than one atmosphere in accordance with the current invention. Chamber 302 has sidewalls 304, a top wall 306, and a bottom wall 308. Chamber 302 is formed generally in the shape of a cylinder having a 4 inch inside diameter between the two side walls. One of skill in the art will, however, recognize that other chamber geometries may be suitable and still remain within the scope of the invention. The chamber is constructed of stainless steel. The wall thickness of the chamber 302 is approximately between 3 and 4 inches. The bottom wall 308 of chamber 302 includes an inlet port 310 for introducing a first reactant gas into the chamber from gas supply 312. This first reactant gas is introduced into the chamber at a pressure greater than 1 atmosphere and approximately equal to the increased atmospheric pressure maintained inside chamber 302. The first reactant gas is pressurized by a pulsating pump 314 and is introduced into expansion chamber 316 before entry into chamber 302. Due to the pulsating nature of pump 314, an expansion chamber 316 is utilized to dampen the gas oscillations before entry of the gas into chamber 302. Pump 314 is preferably an all metal, sealed diaphragm pump that prevents leakage of the input gas. Pump 314 preferably maintains the pressure within chamber 302 up to twenty atmospheres. However, a gas booster pump, known as a Haskel pump may also be used. The Haskel pump is a large area, reciprocating, air-driven piston that is directly connected to a small-area gas piston pump. Pressures up to 10 atmospheres may be maintained. The Haskel pump may leak, however, due to slipping action on the O-ring of the pump. Since leaks may be a significant source of contamination in the form of particulates and likely will have a detrimental effect on the electrical properties of the films deposited, it is thus preferable to utilize an all metal sealed pump.

Chamber 302 also includes a second inlet port 320 on the bottom wall 308 of chamber 302. Inlet port 320 provides for introduction of a second reactant gas supplied from a gas supply 322 into chamber 302. The second reactive gas supplied from supply 322 is introduced into the chamber 302 under pressure, at the equivalent pressure of the chamber. Second reactive gas supplied by 322 is pressurized above 1 atmosphere by pump 324. Pump 324 is identical to pump 314 and is preferably configured as an all metal sealed diaphragm pump. The second reactive gas flows into an expansion chamber 326 before entry into chamber 302. Expansion chamber 326 is identical to expansion chamber 316 and is utilized to dampen the pump oscillations as a result of the pulsating pump 324. Phosphine gas and indium gas are examples of a first and second reactant, respectively. Arsine gas and gallium gas are also examples of a first and second reactant. Reactant gases composed of materials from Group II and Group VI of the Periodic Table are another example of first and second reactants contemplated in the invention. One of ordinary skill in the art will recognize that although two inlets are depicted in FIG. 3, a plurality of gas inlets for introducing a number of gas reactants into chamber 302 is within the scope of the invention.

A substrate 330 on which the first and second reactants is deposited is invertably mounted on a substrate holder, or susceptor 334, and held in place by graphite clips 332. By invertably mounting the substrate 330 on susceptor 334, the system of the current invention takes advantage of the upward flow of the injected gases to reduce the amount of reactant gases required to complete the process. As a result of the upward flow of the gases, the convective force, due to the heating of the substrate, is parallel to the laminar flow, and thus uniform growth is achieved at lower gas velocities without recirculation problems. More of the gases are available for deposition since the convective force does not drive the gases away from the substrate 330. Susceptor 334 is suspended from the top wall 306 of chamber 302 by legs 336. Susceptor or holder 334 has imbedded therein a resistance heater 338 capable of heating the susceptor or holder 334 to a temperature of over 1500° C. The substrate 330, secured to susceptor 334, is heated by thermal conduction from the susceptor 334. Resistance heater 338 is controlled by a temperature controller which heats the susceptor or holder 334 at a rate of 48° C. per minute. The substrate is heated to between 200° C. and 1500° C. for decomposing the reactant gaseous materials. A diffuser 362 can be positioned within the chamber to uniformly diffuse the flow of input reactants from the inlet ports 310 and 320 into chamber 302 and onto substrate 330.

The first and second reactants are deposited onto the substrate 330 using the MOCVD process while maintaining a pressure of greater than 1 atmosphere in the interior of chamber 302. Preferably, for Group III - V semiconductor compounds, a pressure of approximately 34 atmospheres is maintained within chamber 302. However, the pressure is dependent on the particular reactants. In one embodiment of the invention, the pumps 314 and 324 are capable of maintaining a pressure of up to twenty atmospheres. The pressure within chamber 302 is created by introducing an inert gas from gas supply 342 under pressure into the chamber 302. The gas is inert in the sense that the gas does not participate in the MOCVD process other than to pressurize the interior of cylinder 302 to the desired atmospheric pressure. Examples of such gases which are suitable for the current invention are hydrogen gas, nitrogen gas, and argon gas. Pump 344, again identical to pump 314 and pump 324, is a pulsating pump used to create the pressure within chamber 302. Expansion chamber 346 is identical to expansion chambers 316 and 326 and is used similarly to dampen the pump oscillations of the pulsating pump 344. Pump 344 is capable of creating pressures within chamber 302 up to twenty atmospheres. The inert gas from gas supply 342 enters the chamber at the gas inlet 340. A downstream pressure control valve 356 maintains the chamber pressure at the desired setting. As a result of the invertably mounted substrate 330 on susceptor 334 and the position of the inlet ports for the reactant gases, the reactants enter in an upward flow into the chamber 302 through the diffuser 362, which is a fine mesh inlet screen causing uniform dispersion of the gases. The pressure control valve may also be mounted upstream of the reaction chamber with appropriate downstream restrictions added, such as a heated orifice.

Chamber exhaust gases flow through a two-port symmetrical arrangement into tubing 352 and 354 which join to form tube 358 and are exhausted out of the system by exhaust 360. It has been found that to avoid clogging of the chamber pressure valve 356, a cold condensing coil, maintained in an ice bath, and a large area filter may be added to the exhaust line 358 before the pressure control valve 356.

Experimental Results

In order to compare the amount of reactant gases utilized in a MOCVD process operating at a pressure greater than one atmosphere and a conventional MOCVD process operating at atmospheric pressure, a series of experiments was performed. In each of these experiments a MOCVD reactor system as shown in FIG. 3 was used to deposit an InP layer on the substrate. However, in the experiments performed at one atmosphere the pumps were disconnected so as not to pressurize the chamber or the gases. For InP growth at one atmosphere, the temperature of the susceptor was kept at a constant 600° C. For growth at 3 atmospheres, the temperature was varied between 500° C. and 650° C. to determine the optimum temperature for the growth process. In each of the experiments, the resultant crystals were analyzed to determine their quality. Good quality wafers exhibit a smooth and specular surface finish. The results of the experiments are listed in Table 1 below.

reacts with indium in a ratio of 1:1 to form InP, these findings are very close to the theoretical limit. The experiments evidence that a MOCVD process performed above atmospheric pressure creates semiconductor crystals of good quality at reduced levels of toxins for Group III - V semiconductors.

Figure 4:
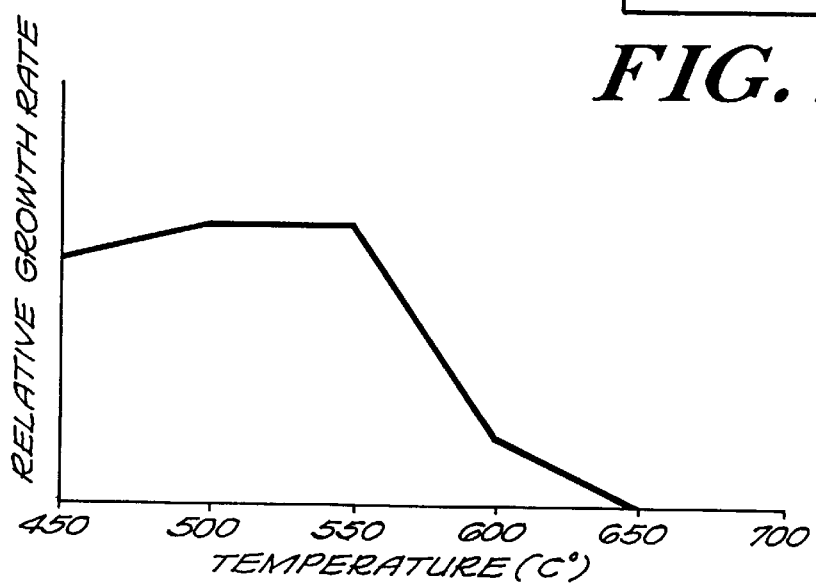
FIG. 4 shows a graph of rate of deposition versus temperature according to the present invention.

The experimental results further demonstrate that the InP growth rate at 3 atmospheres is highly temperature dependent. Between 500° C. and 550° C. good growth rates and morphologies can be obtained. At temperatures below 500° C. the surface is rough, and the crystal cannot be used for a semiconductor device. While crystals grown at 600° C. have specular surfaces, the growth rate is very slow. Deposition rates fall to approximately zero at temperatures above 650° C. FIG. 4 graphs the influence of temperature on the growth rate of InP at 3 atmospheres.

Figure 5:
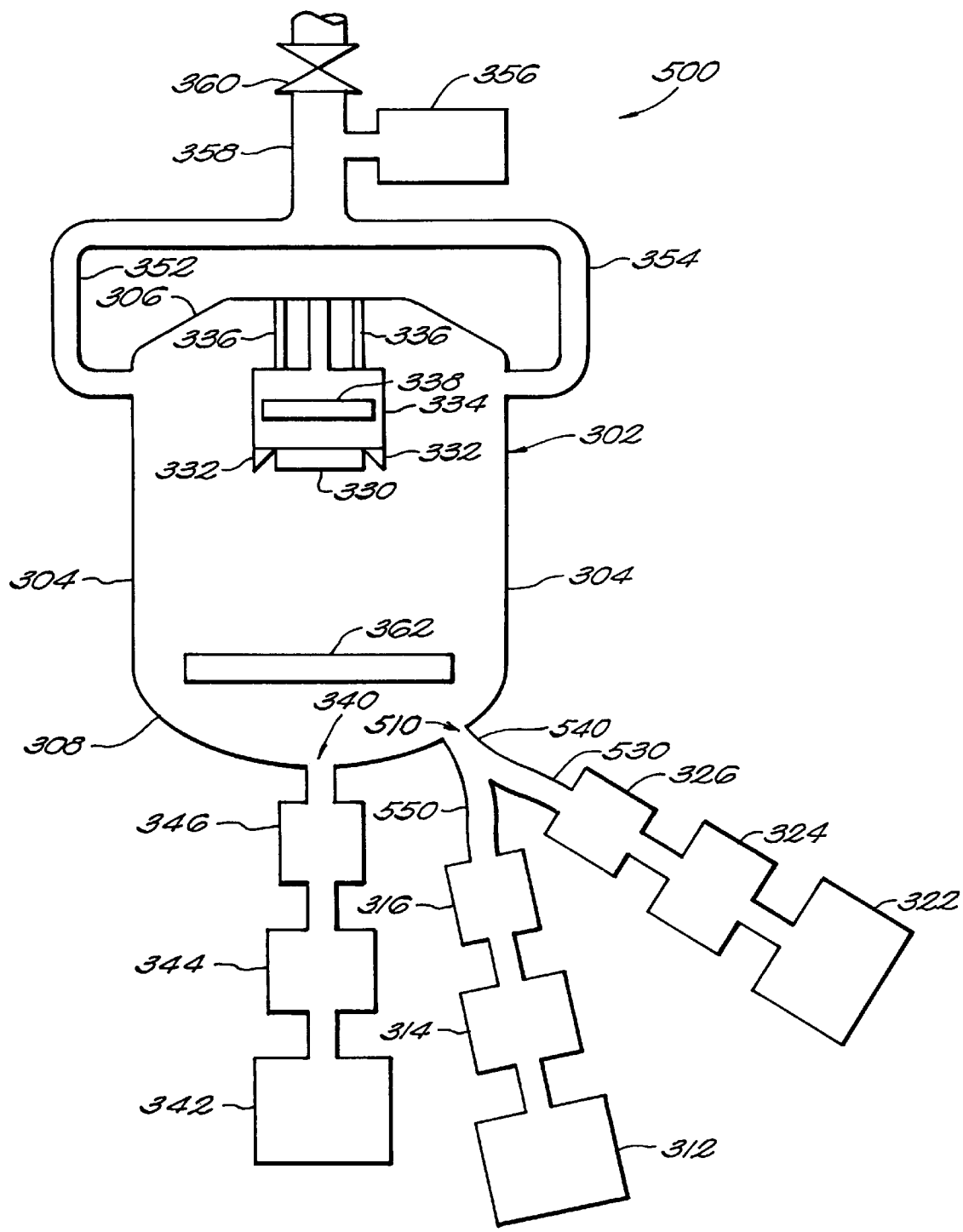
FIG. 5 shows an alternative embodiment of a MOCVD reactor system according to the present invention having a single inlet port for introducing gaseous reactants into the chamber of the system.

FIG. 5 shows another embodiment of the invention. In this embodiment, a MOCVD reactor system is shown that is similar to the system of FIG. 3 except that the system 500 of FIG. 5 includes only one inlet port 510 into the chamber 302. Multiple gases may be introduced serially into the chamber 302 through inlet port 510. A first reactant gas is

TABLE 1

InP growth data at reactor pressures of one and three atmospheres.

| V:III Ratio | Material Type | Hall Mobility $cm^2$/V-sec | Doping $cm^{-3}$ | Substrate Temp °C. | Film Thickness A° | Surface Condition |
|---|---|---|---|---|---|---|
| Atmospheric Pressure Growth | | | | | | |
| 24.8 | N | 1705 | 9.4E16 | 600 | 2500 | Specular and smooth |
| 12 | N | 1958 | 6.8E16 | 600 | 2500 | Specular and smooth |
| 6.2 | N | 1525 | 1E17 | 600 | 2500 | Hazy and rough |
| Growth @ 3 Atmospheres | | | | | | |
| 6.2 | N/A | N/A | N/A | 650 | Zero | No growth at 650° C. |
| 6.2 | N | N/A, too thin | N/A, too thin | 600 | <200 | Specular and smooth. Growth rate very low at 600° C. |
| 3.3 | N | 1645 | 2E17 | 550 | 5000 | Specular and smooth |
| 1.6 | N | 1700 | 2E17 | 550 | 5000 | Specular and smooth |
| 1.6 | N | 921 | 9E17 | 500 | 5000 | Specular and smooth |
| 1.1 | N | N/A | N/A | 450 | 5000 | Very rough |
| 3.3 | N | N/A | N/A | 550 | 10,000 | Grown on InGaAs/InP sample previously grown on another reactor. Surface is specular with a slight texture at 200× |
| 1.1 | N | N/A | N/A | 550 | 10,000 | Grown on InGaAs/InP sample previously grown on another reactor. Surface is specular with a slight texture at 200× |

In analyzing the data for the crystals grown at atmospheric pressure, at least 12 times as much phosphorus was needed as indium to produce good quality crystals. When only 6 times as much phosphorus was used, the crystalline surface was hazy, rough, and unsuitable for a semiconductor device.

At chamber pressures of 3 atmospheres, it is clearly seen that good quality crystals can be grown at reduced phosphorus to indium levels. While good quality crystals could not be grown at atmospheric pressure with the phosphorus to indium ratio approximately 6:1, it is seen that when the pressure is increased to 3 atmospheres the opposite is true. Furthermore the experiments demonstrate that good quality crystals can be grown under pressure with phosphorus to indium ratios of 1.1 to 1. Since phosphorus completely supplied from gas supply 322, and introduced into the chamber at inlet port 510 through tubing 530 and 540. Similarly, a second reactant gas from gas supply 312 is introduced into the chamber 302 at inlet 510 through tubing 550 and 540. It is necessary to clean the inlet port 510 and tubing 540 at regular intervals to prevent blockage of the passage ways due to excessive buildup of solidified byproducts of the reactants.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall there between.

Having described the invention, what is claimed as new and desired to be secured by Letters Patent is:

1. A method for growing an epitaxial semiconductor layer on a substrate in an MOCVD reactor chamber, the method comprising the steps of, introducing a substrate at a top portion of the MOCVD reactor chamber, pressurizing one or more reactant gaseous materials to a pressure above one (1) atmosphere, injecting the pressurized reactant gaseous material from a bottom portion of the MOCVD reactor chamber into the MOCVD reactor chamber in an upward flow toward the substrate, and heating the substrate to decompose the pressurized reactant gaseous material and to cause the reactant gaseous material to flow parallel with convective forces toward said substrate, such that the pressurized reactant gaseous material grows an epitaxial layer on the substrate.

2. The method of claim 1, further including the step of injecting an inert gas into the reactor chamber to pressurize the reactor chamber above one atmosphere.

3. The method of claim 2, further including the step of varying the amount of reactant gaseous material injected into the reactor chamber as a function of the amount of inert gas injected into the reactor chamber.

4. The method of claim 1, further including the step of invertably mounting the substrate on a substrate holder for facing the injected reactant gaseous materials.

5. The method of claim 1, further including the step of selecting the reactant gaseous material from elements found in group V of the periodic table.

6. The method of claim 5, further including the step of selecting the reactant gaseous material from the group consisting of phosphine and arsine.

7. The method of claim 5, further including the step of selecting a further reactant gaseous material from elements found in group III of the periodic table.

8. The method of claim 1, wherein the pressurizing step includes pressurizing one of the reactant gaseous material in the range of above one (1) to twenty (20) atmospheres.

9. The method of claim 1, further including the step of uniformly diffusing the reactant gaseous materials after introducing the gaseous material into the chamber.

10. The method of claim 1, further including the step of selecting the reactant gaseous material from elements found in group II of the periodic table.

11. The method of claim 10, further including the step of selecting an additional reactant gaseous material from elements found in group VI of the periodic table.

12. The method of claim 1, wherein the substrate is heated to between 200° C. and 500° C. for decomposing the pressurized reactant gaseous materials.

* * * * *